(12) United States Patent
Shiga et al.

(10) Patent No.: US 7,569,911 B2
(45) Date of Patent: Aug. 4, 2009

(54) SEMICONDUCTOR DEVICE HAVING AN IMPROVED WIRING OR ELECTRODE STRUCTURE

(75) Inventors: Toshihiko Shiga, Tokyo (JP); Hitoshi Nakamura, Tokyo (JP); Junji Tanimura, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 364 days.

(21) Appl. No.: 11/410,194

(22) Filed: Apr. 25, 2006

(65) Prior Publication Data

US 2007/0035024 A1      Feb. 15, 2007

(30) Foreign Application Priority Data

Aug. 9, 2005   (JP) ............................. 2005-230728

(51) Int. Cl.
*H01L 29/93* (2006.01)

(52) U.S. Cl. .................... 257/576; 257/745; 257/155; 257/928; 310/312

(58) Field of Classification Search .............. 257/54, 257/73, 155–156, 267, 280–284, 449–457, 257/928, E51.009, E33.051, 664, 81, 99, 257/E21.047, E21.064, E21.163, E21.173, 257/565–566, 575–576, 745; 310/311–312

See application file for complete search history.

(56) References Cited

U.S. PATENT DOCUMENTS

| | | | |
|---|---|---|---|
| 4,300,149 A | | 11/1981 | Howard et al. |
| 6,365,969 B1 * | | 4/2002 | Yamaguchi et al. ......... 257/745 |
| 6,396,854 B1 * | | 5/2002 | Takagi ......................... 372/20 |
| 6,610,995 B2 * | | 8/2003 | Nakamura et al. ............ 257/13 |
| 7,323,783 B2 * | | 1/2008 | Nakayama et al. .......... 257/765 |
| 2005/0151255 A1 | | 7/2005 | Ando et al. |
| 2005/0190416 A1 * | | 9/2005 | Yoneda ........................ 359/27 |
| 2005/0274980 A1 * | | 12/2005 | Miyoshi ..................... 257/192 |

FOREIGN PATENT DOCUMENTS

| | | |
|---|---|---|
| JP | 56-37672 | 4/1981 |
| JP | 62-224083 | 10/1987 |
| JP | 2004-022773 | 1/2004 |

* cited by examiner

*Primary Examiner*—W. David Coleman
*Assistant Examiner*—Su C Kim
(74) *Attorney, Agent, or Firm*—Leydig, Voit & Mayer, Ltd.

(57) ABSTRACT

An ohmic electrode is formed by stacking a lower Ti layer, a diffusion preventing layer, an upper Ti layers and a metallic (Au) layer on a p-type GaAs layer. The diffusion preventing layer includes tantalum (Ta) or niobium (Nb). Thus, interdiffusion of Ga and As in the p-type GaAs layer and Au in the metallic layer can be prevented, and variation in resistivity of the ohmic electrode in a high-temperature, high-humidity environment can be suppressed.

8 Claims, 4 Drawing Sheets

Depth from the surface of the metallic layer

SEMICONDUCTOR DEVICE HAVING AN IMPROVED WIRING OR ELECTRODE STRUCTURE

BACKGROUND OF THE INVENTION

1. Field of the Invention

The present invention relates to a semiconductor device, more specifically, to the wiring or electrode structure of a compound semiconductor device.

2. Background Art

As a material for a compound semiconductor device, a compound semiconductor, such as GaAs and InP, is used. As an electrode and wiring of a compound semiconductor device, gold (Au) is widely used.

These electrode and wiring are subjected to heat during the manufacturing process, or when used as a product. At this time, Au contained in the electrode or wiring causes interdiffusion between the electrode or wiring and the compound semiconductor or the aluminum (Al) electrode. Then the characteristics of the semiconductor device are changed or deteriorated.

In Japanese Unexamined Patent Publication No. 2004-22773, an electrode structure wherein a molybdenum (Mo) metallic layer and a gold (Au) metallic layer are sequentially stacked on a nickel (Ni) metallic layer is disclosed. Since the melting point of a Mo metallic layer is high, interdiffusion between the Ni metallic layer and the Au metallic layer can be prevented.

However, Mo is relatively inferior in moisture resistance and corrosion resistance. Therefore, when a compound semiconductor device using Mo as the diffusion preventing layer is exposed to water, an aqueous solution, or a high-temperature or high-humidity environment, it is easily corroded. Thereby, defects, such as the elevation of device resistance, poor conduction, and short-circuiting between wirings, will occur.

SUMMARY OF THE INVENTION

The present invention has been developed to solve the above-described problems, and therefore it is an object of the present invention to provide a wiring structure or an electrode structure in a compound semiconductor device using Au as the electrode or wirings wherein interdiffusion between Au and the compound semiconductor or between Au and the Al electrode is prevented, and moisture resistance and corrosion resistance are improved.

The above object is achieved by a semiconductor device comprising a first layer formed of a compound semiconductor layer or an electrically conductive layer, a metallic layer formed on the upper or lower side of said first layer, which contains Au, and a diffusion preventing layer formed between the first layer and the metallic layer, which contains Ta or Nb.

According to the present invention, a wiring structure or an electrode structure can be obtained wherein, in a compound semiconductor device using Au as the electrode or wirings, interdiffusion between Au and the compound semiconductor or between Au and the Al electrode is prevented, and moisture resistance and corrosion resistance are improved. Other features and advantages of the invention will be apparent from the following description taken in connection with the accompanying drawings.

DEATAILED DESCRIPTION OF THE PREFERRED EMBODIMENTS

Figure 1:
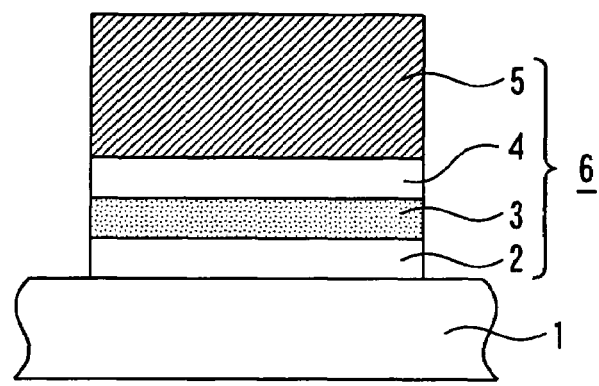
FIG. 1 is a cross-sectional view illustrating a semiconductor device of the first embodiment.

Embodiments of the present invention will be described below referring to the drawings. In the drawings, the same or equivalent parts will be denoted by the same reference numerals, and the description thereof will be simplified or omitted.

First Embodiment

A cross-sectional structure of a semiconductor device according to a first embodiment is shown in FIG. 1. This is a cross-sectional structure of an ohmic electrode formed on a p-type GaAs layer. A p-type GaAs layer 1 is formed on a GaAs substrate (not shown). Thereon, a lower Ti layer 2 (film thickness of about 50 nm), a diffusion preventing layer 3 (film thickness of about 50 nm), an upper Ti layer 4 (film thickness of about 50 nm), and a metallic layer 5 (film thickness of about 250 nm) are formed. Hereafter, a stacked film formed of the lower Ti layer 2, the diffusion preventing layer 3, the upper-Ti layer 4, and the metallic layer 5 is referred to as an "ohmic electrode" 6. The ohmic electrode 6 having a predetermined width is formed on the p-type GaAs layer 1. As the diffusion preventing layer 3, tantalum (Ta) is used, and as the metallic layer 5, gold (Au) is used.

In other words, in the above-described structure, a diffusion preventing layer 3 consisting of Ta is formed between a p-type GaAs layer 1 and a metallic (Au) layer 5.

Here, the diffusion preventing layer is used for preventing elements contained in the upper layer and the lower layer from diffusing with each other (interdiffusion). The suppressing effect of interdiffusion when Ta is used as the above-described diffusion preventing layer 3 will be described.

Figure 2:
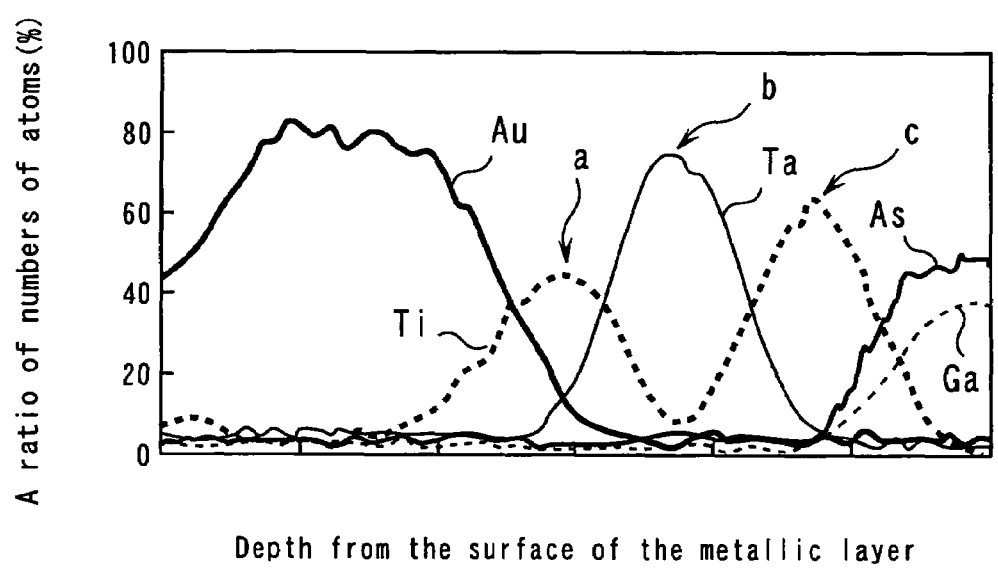
FIG. 2 is the ratio of numbers of atoms of the constituting elements of a semiconductor device of the first embodiment.

The ohmic electrode 6 shown in FIG. 1 is heated at 475° C. for 10 minutes. This sample was measured using Auger electron spectroscopy. The ratio of numbers of atoms of the constituting elements thereby obtained is shown in FIG. 2. The depth from the surface side of the metallic layer 5 (refer to FIG. 1) toward the p-type GaAs layer 1 is shown in the abscissa; and the ratio of numbers of atoms of the constituting elements corresponding to each position is shown in the ordinate.

In the area a little right of the center of the abscissa, the Ti peak "a" of the upper Ti layer 4, the Ta peak "b" of the diffusion preventing layer 3, and the Ti peak "c" of the lower Ti layer 2 are present in the order from the left. The peak of Au is present to the left of the peak "a", and little Au is present to the right of the peak "c". It can be known from this that the diffusion of Au in the metallic layer 5 toward the p-type GaAs layer 1 side is effectively suppressed. To the right of the peak "c", the peaks of Ga and As are present, and to the left of the peak "a", little Ga and As is present. It can be known from this that the diffusion of Ga and As in the p-type GaAs layer 1 toward the metallic layer 5 side is effectively suppressed.

From the above, it is known that the interdiffusion of Ga and As in the p-type GaAs layer 1 and Au in the metallic layer 5 can be effectively suppressed by using Ta as the diffusion preventing layer 3, even under high-temperature conditions.

Next, moisture resistance when Ta is used as the above-described diffusion preventing layer 3 will be described.

First, a sample wherein a Ta film (film thickness of about 100 nm) was formed on a semiconductive GaAs substrate, and a sample wherein a molybdenum (Mo) film (film thickness of about 100 nm) was formed on a semiconductive GaAs substrate were prepared. Next, the resistivity of each of these samples ($R_1$) was measured. Next, these samples were exposed to a high-temperature, high-humidity environment, and the resistivity of each of these samples ($R_2$) was measured. Then, the percentage change in resistivity between before and after exposure (($|R_2 - R_1|/R_1$)×100 (%)) for each sample was compared.

Figure 3:
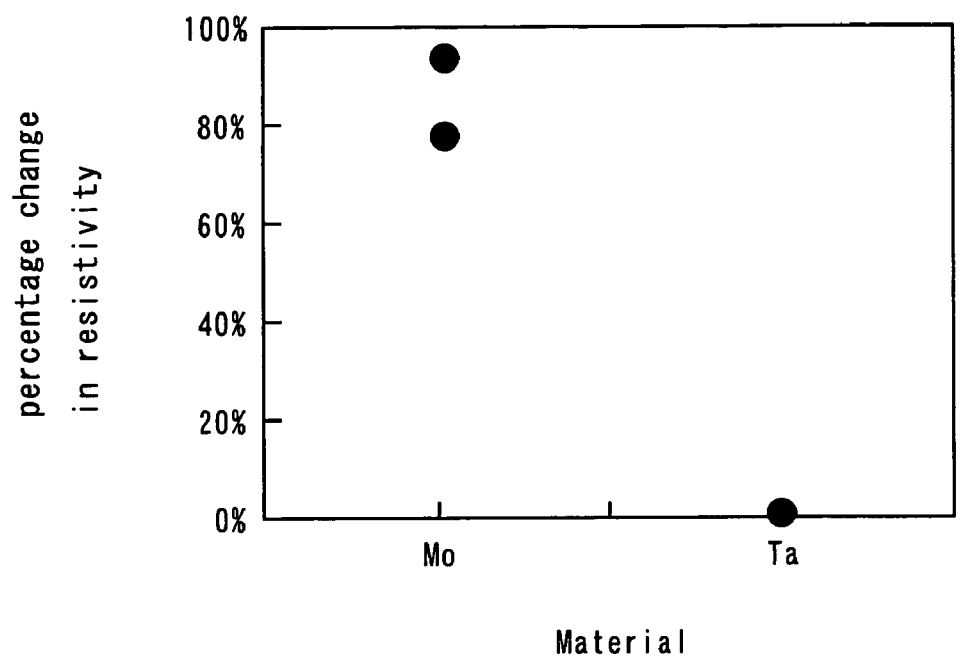
FIG. 3 is the percentage change in resistivity of a semiconductor device of the first embodiment.

The results of comparing the percentage change in resistivity for each of the above-described samples are shown in FIG. 3. The percentage change in resistivity of the sample wherein the Mo film is formed is 75% to 80% or higher. Whereas, it is known that the percentage change in resistivity of the sample wherein the Ta film is formed is suppressed to substantially zero. This shows that moisture resistance is dramatically improved by using a Ta film as the diffusion preventing layer 3 compared with the case using an Mo film.

From the above, when a Ta film is used as the diffusion preventing layer 3, the corrosion of the diffusion preventing layer and the deterioration of device properties can be suppressed even in a high-temperature, high-humidity environment.

In the first embodiment, a structure is described wherein a diffusion preventing layer 3 is formed on the upper layer of a p-type GaAs layer 1, and a metallic layer 5 is formed thereon. However, an Au-containing metallic layer can be formed under a p-type GaAs layer 1, and a diffusion preventing layer can be formed between these layers. Furthermore, the above-described p-type GaAs layer 1 can be substituted by a p-type GaN layer or the like. Even in these structures, the same effect as in the above-described first embodiment can also be obtained.

Next, a modification of the above-described first embodiment will be described.

In the above-described first embodiment, Ta is used as the diffusion preventing layer 3. Alternatively, niobium (Nb) can be used. Nb is, like Ta, in the Va group of the periodic table, and the chemical and physical properties thereof are very similar to those of Ta. Therefore, it is considered that even if Nb is used as the diffusion preventing layer 3, the same effect as in the above-described first embodiment can also be obtained.

Second Embodiment

Figure 4:
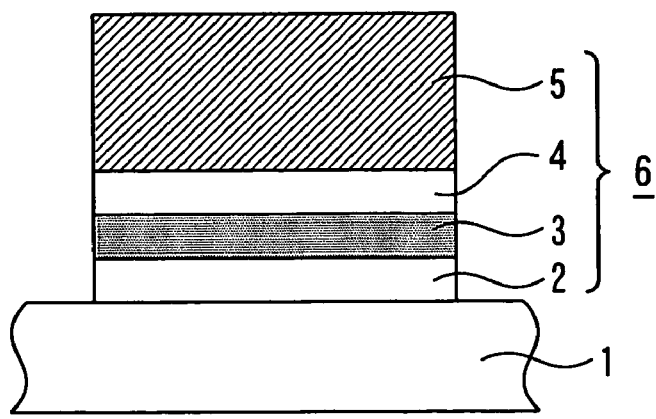
FIG. 4 is a cross-sectional view illustrating a semiconductor device of the second embodiment.

A cross-sectional structure of a semiconductor device according to a second embodiment is shown in FIG. 4. Here, the second embodiment is described focusing on the aspects different from the first embodiment. In the structure, as in the first embodiment, an ohmic electrode is formed on a p-type GaAs layer. In the second embodiment, the structure using an alloy film formed of Mo and Nb is used as a diffusion preventing layer 3. Since other constitutions are equivalent to those of the first embodiment, the description thereof will be omitted.

By using an alloy film formed of Mo and Nb as the diffusion preventing layer 3, in the same way as in the case wherein Mo or Nb is used alone, the interdiffusion of Ga and As in the p-type GaAs layer 1, and Au in the metallic layer 5 can be effectively suppressed.

Next, moisture resistance when an alloy film formed of Mo and Nb is used as the diffusion preventing layer 3 will be described.

First, a sample wherein an alloy film formed of Mo and Nb (film thickness of about 100 nm) was formed on a semiconductive GaAs substrate, and a sample wherein a molybdenum (Mo) film (film thickness of about 100 nm) was formed on a semiconductive GaAs substrate were prepared. The sample wherein an alloy film formed of Mo and Nb had an Nb content (ratio of numbers of atoms) within a range between 1% and 8%, and a plurality of the samples were prepared. In the same manner as in the first embodiment, the percentage change in resistivity between before and after exposure for each sample was compared. The definition of the percentage change in resistivity is same as the definition in the first embodiment.

Figure 5:
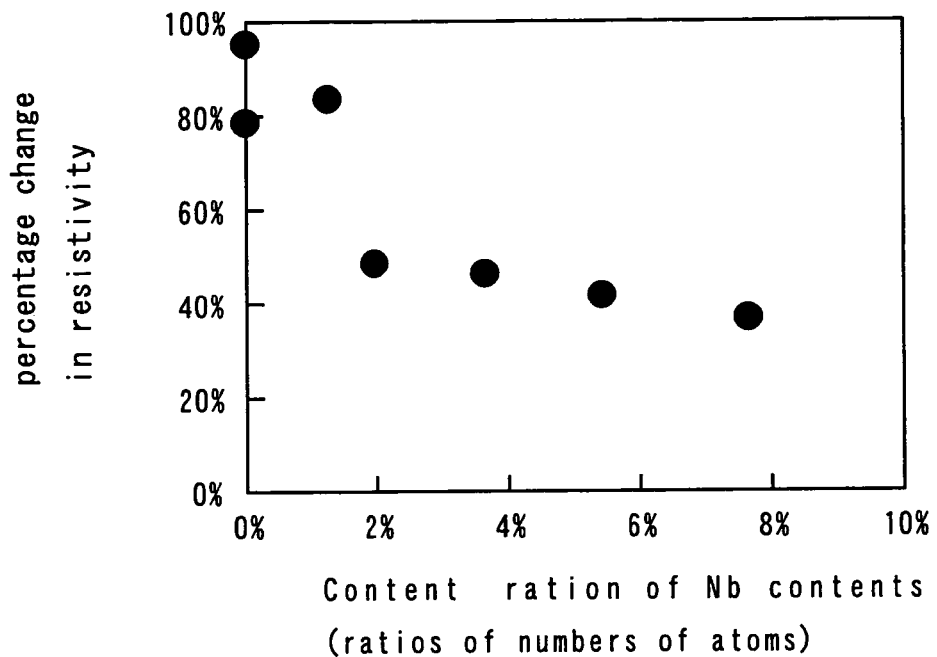
FIG. 5 is the percentage change in resistivity of a semiconductor device of the second embodiment.

The results of comparing the percentage change in resistivity for each of the above-described samples are shown in FIG. 5, taking the Nb contents (ratios of numbers of atoms) on the abscissa. When Nb is 0%, i.e., when the film is formed of Mo alone, the percentage change in resistivity is 75% to 80% or higher. Whereas, it is known that the percentage change in resistivity of the sample having the Nb content is 20% or higher is suppressed to 50% or less. This shows that moisture resistance is improved by using an alloy film formed of Mo and Nb as the diffusion preventing layer 3 compared with the case using a film formed of Mo alone.

Nb is a metal having higher moisture resistance and corrosion resistance than Mo. Therefore, it is considered that moisture resistance is improved by alloying Mo by adding Nb.

Next, the mechanical strength of the above-described diffusion preventing layer 3 will be described. When the above-described alloy film is used, the content of Nb atoms is preferably about 20% or less. The reason is that by suppressing Nb content to be low as described above, the mechanical strength (modulus of elasticity, hardness, etc.) of the ohmic electrode 8 can be substantially equivalent to a film formed of Mo alone.

From the above, when an alloy film formed of Mo and Nb is used as the diffusion preventing layer 3, the content of Nb atoms is preferably within a range between 2 and 20% when both moisture resistance and mechanical strength are considered. Thereby, in comparison with a film formed of Mo alone, the mechanical strength of the ohmic electrode 8 can be equivalent, and the percentage change in resistivity in a high-temperature, high-humidity environment can be reduced.

The crystal structure of both Nb and Mo is a body-centered cubic lattice. Therefore, when these elements are mixed in any mixing ratio, a solid solution is formed without separating to the Mo phase and the Nb phase. Therefore, when a thin film of the alloy is formed, there is the advantage in that the control of the crystal structure is easy. Since the elevation in resistivity of the alloy film is less than that of a film formed of Mo alone, favorable device characteristics can be obtained.

Next, a modification of the second embodiment will be described.

In the above-described second embodiment, an alloy film formed of Mo and Nb is used as the diffusion preventing layer 3. Alternatively, an alloy film formed of Mo and Ta can also be used.

Ta is, like Nb, in the Va group of the periodic table, and the chemical and physical properties thereof are very similar to those of Nb. Therefore, it is considered that even if an alloy film formed of Mo and Ta is used as the diffusion preventing layer 3, the same effect as in the above-described second embodiment can be also obtained.

The diffusion preventing layer 3 can be not only the above-described alloy film, but also an alloy film formed of Ta, Nb and Mo. It is considered that even if such an alloy film is used, the same effect as in the above-described second embodiment can also be obtained.

Third Embodiment

Figure 6:
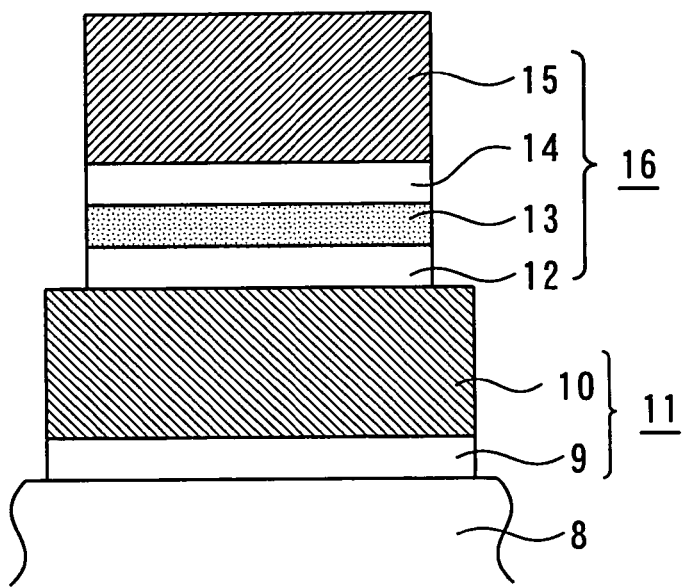
FIG. 6 is a cross-sectional view illustrating a semiconductor device of the third embodiment.

A cross-sectional structure of a semiconductor device according to a third embodiment is shown in FIG. 6. Here, the third embodiment is described focusing on the aspects different from the first and second embodiments. FIG. 6 shows a cross-sectional structure of a Schottky electrode formed on an n-type GaAs layer, and a wiring formed thereon.

An n-type GaAs layer 8 is formed on a substrate (not shown). On the n-type GaAs layer 8, a Ti film 9 (film thickness of about 50 nm) and a first metallic layer 10 (film thickness of about 500 nm) are formed in predetermined widths (hereafter, the stacked film formed of the Ti film 9 and the first metallic layer 10 is referred to as "Schottky electrode 11"). As the first metallic layer 10, aluminum (Al) is used.

On the Schottky electrode 11, a lower Ti layer 12 (film thickness of about 50 nm), a diffusion preventing layer 13 (film thickness of about 50 nm), an upper Ti layer 14 (film thickness of about 50 nm), and a second metallic layer 15 (film thickness of about 800 nm) are sequentially formed from the bottom (hereafter, the stacked film formed of the lower Ti layer 12, the diffusion preventing layer 13, the upper Ti layer 14, and the second metallic layer 15 is referred to as "wiring layer 16"). The wiring layer 16 is formed on the Schottky electrode 11 in a predetermined width narrower than the width of the Schottky electrode 11.

As the diffusion preventing layer 13, tantalum (Ta) is used. As the second metallic layer 15, gold (Au) is used.

The above-described structure is a structure wherein Ta is used as the diffusion preventing layer 13 between the first metallic layer 10 and the second metallic layer 15. By the above-described structure, the diffusion of Al in the first metallic layer 10 toward the second metallic layer 15 side can be suppressed, and the diffusion of Au in the second metallic layer 15 toward the first metallic layer 10 side can be suppressed. In other words, interdiffusion of Al in the first metallic layer 10 and Au in the second metallic layer 15 can be suppressed.

Next, a modification of the above-described third embodiment will be described.

As described in the first embodiment, Ta can be substituted with Nb in the above-described diffusion preventing layer 13. Alternatively, as described in the second embodiment and the modification thereof, an alloy film formed of Mo and Nb, an alloy film formed of Mo and Ta, or an alloy film formed of Ta, Nb and Mo can also be used.

By using these films, the same effect as in the above-described third embodiment can also be obtained from the above-described third embodiment.

Fourth Embodiment

Figure 7:
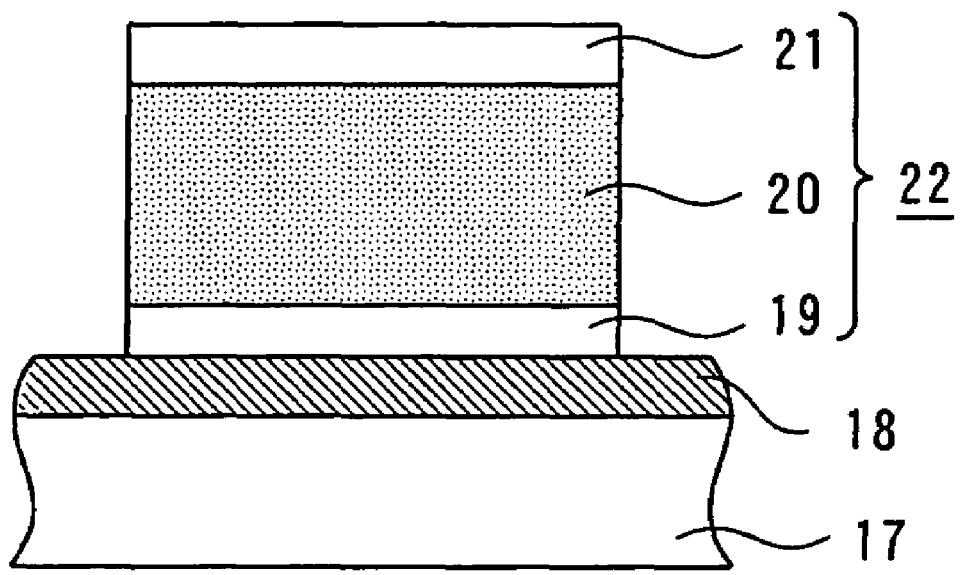
FIG. 7 is a cross-sectional view illustrating a semiconductor device of the fourth embodiment.

A cross-sectional structure of a semiconductor device according to a fourth embodiment is shown in FIG. 7. Here, the fourth embodiment is described focusing on the aspects different from the first to third embodiments. This structure is a structure wherein an Au-containing metallic wiring is formed on an n-type GaAs layer.

An n-type GaAs layer 17 is formed on a substrate (not shown). An interlayer insulating film 18 formed of a silicon nitride film is formed thereon. A Ti film 19 (film thickness of about 50 nm), a metallic layer 20 formed of Au (film thickness of about 2000 nm), and a protective layer 21 formed of Ta or Nb are stacked on the interlayer insulating film 18 (hereafter, the stacked film formed of the Ti film 19, the metallic layer 20, and the protective layer 21 is referred to as a "metallic wiring 22"). The metallic wiring 22 is formed on the interlayer insulating film 18 in a predetermined width.

The above-described metallic layer 20 can contain other metals, such as Al.

A semiconductor device may be subjected to an external mechanical impact during the manufacturing process or when used as a product. The metallic film, such as Au and Al, contained in the metallic layer 20 is a film having a relatively low mechanical hardness. However, by providing the protective layer 21 on the metallic layer 20, the occurrence of defect in the metallic wiring 22 can be prevented. In other words, the mechanical strength of the metallic wiring 22 can be improved.

Furthermore, as shown in the first embodiment, Ta and Nb excel in moisture resistance compared with Mo. Therefore, in comparison with the case wherein Mo is used as the protective layer, the variation in the resistivity of the wiring in a high-temperature, high-humidity environment can be lowered.

Next, a modification of the above-described fourth embodiment will be described.

In the above-described fourth embodiment, Ta or Nb is used as the protective layer 21. Alternatively, an alloy film formed of Mo and Ta, an alloy film formed of Mo and Nb, or an alloy film formed of Mo, Ta and Nb can also be used. By using any of these films as the protective layer, the mechanical strength of the metallic wiring 22 can be improved.

Furthermore, when the above-described alloy films are used, the content of Ta or Nb atoms is preferably within a range between 2 and 20%. Thereby, the mechanical strength of the metallic wiring 22 can be improved, and the percentage change in resistivity in a high-temperature, high-humidity environment can be lowered. Obviously many modifications and variations of the present invention are possible in the light of the above teachings. It is therefore to be understood that within the scope of the appended claims the invention may by practiced otherwise than as specifically described.

The entire disclosure of a Japanese Patent Application No. 2005-230728, filed on Aug. 9, 2005 including specification, claims, drawings and summary, on which the Convention priority of the present application is based, are incorporated herein by reference in its entirety.

What is claimed is:
1. A wiring structure for a semiconductor device, the wiring structure comprising:
  a compound semiconductor material; and
  an electrode structure supported by the compound semiconductor material and comprising a plurality of layers sequentially stacked in the following order, from the semiconductor material outward, the plurality of layers consisting of
    a first Ti layer,
    a diffusion preventing layer in contact with the first Ti layer and selected from the group consisting of Ta and Nb,
    a second Ti layer on the diffusion preventing layer, and
    a Au contact layer on the second Ti layer.

2. The wiring structure according to claim 1 wherein the compound semiconductor material is p-type GaAs and the wiring structure forms an ohmic contact with the compound semiconductor material.

3. A wiring structure for a semiconductor device, the wiring structure comprising:
a compound semiconductor material; and
an electrode structure supported by the compound semiconductor material and comprising a plurality of layers sequentially stacked in the following order, from the semiconductor material outward, the plurality of layers consisting of
a first Ti layer,
a diffusion preventing layer in contact with the first Ti layer that is an alloy of Mo with at least one of Ta and Nb and contains at least one of Ta and Nb in an atomic concentration within a range from 2% to 20%,
a second Ti layer on the diffusion preventing layer, and
a Au contact layer on the second Ti layer.

4. The wiring structure according to claim 3 wherein the compound semiconductor material is p-type GaAs and the wiring structure forms an ohmic contact with the compound semiconductor material.

5. A wiring structure for a semiconductor device, the wiring structure comprising:
a compound semiconductor material;
an electrode structure supported by the compound semiconductor material and comprising a plurality of layers sequentially stacked in the following order, from the semiconductor material outward, the plurality of layers consisting of
a first Ti layer,
a diffusion preventing layer in contact with the first Ti layer and selected from the group consisting of Ta, Nb, and an alloy of Mo with at least one of Ta and Nb,
a second Ti layer on the diffusion preventing layer, and
a Au contact layer on the second Ti layer: and
a Schottky barrier structure interposed between the electrode structure and the compound semiconductor material, the Schottky barrier structure consisting of a third Ti layer in contact with the compound semiconductor material and an Al layer interposed between and contacting the first and third Ti layers.

6. The wiring structure according to claim 5, wherein the compound semiconductor material is n-type GaAs.

7. A wiring structure for a semiconductor device, the wiring structure comprising:
a compound semiconductor material;
an electrode structure supported by the compound semiconductor material and comprising a plurality of layers sequentially stacked in the following order, from the semiconductor material outward, the plurality of layers comprising
a first Ti layer,
a diffusion preventing layer in contact with the Ti layer and selected from the group consisting of Ta, Nb, and an alloy of Mo with at least one of Ta and Nb,
a Au contact layer supported by the diffusion preventing layer, and
a Schottky barrier structure interposed between the electrode and the compound semiconductor material, the Schottky barrier structure consisting of a second Ti layer in contact with the compound semiconductor material and an Al layer interposed between and contacting the first and second Ti layers.

8. The wiring structure according to claim 7, wherein the compound semiconductor material is n-type GaAs.

* * * * *